US007827187B2

(12) United States Patent
Raman et al.

(10) Patent No.: US 7,827,187 B2
(45) Date of Patent: Nov. 2, 2010

(54) FREQUENCY PARTITIONING: ENTROPY COMPRESSION WITH FIXED SIZE FIELDS

(75) Inventors: Vijayshankar Raman, Sunnyvale, CA (US); Garret Frederick Swart, Palo Alto, CA (US)

(73) Assignee: International Business Machines Corporation, Armonk, NY (US)

( * ) Notice: Subject to any disclaimer, the term of this patent is extended or adjusted under 35 U.S.C. 154(b) by 390 days.

(21) Appl. No.: 12/098,079

(22) Filed: Apr. 4, 2008

(65) Prior Publication Data

US 2009/0254521 A1 Oct. 8, 2009

(51) Int. Cl.
*G06F 17/30* (2006.01)

(52) U.S. Cl. .......................... 707/750; 707/752; 382/239

(58) Field of Classification Search ................. 707/750, 707/752; 382/239
See application file for complete search history.

(56) References Cited

U.S. PATENT DOCUMENTS

| | | | |
|---|---|---|---|
| 6,018,738 A * | 1/2000 | Breese et al. ............... 707/749 |
| 6,049,630 A * | 4/2000 | Wang et al. ................. 382/239 |
| 6,309,424 B1 * | 10/2001 | Fallon ......................... 341/51 |
| 6,661,839 B1 * | 12/2003 | Ishida et al. ................ 375/240 |
| 7,111,094 B1 | 9/2006 | Liu et al. |
| 7,239,754 B2 | 7/2007 | Akimoto et al. |
| 7,251,648 B2 * | 7/2007 | Chaudhuri et al. .......... 707/749 |
| 7,339,501 B2 * | 3/2008 | Ban et al. .................... 341/51 |
| 7,466,742 B1 * | 12/2008 | Srinivasan .................. 375/132 |
| 7,711,736 B2 * | 5/2010 | Levin ......................... 707/737 |
| 7,739,275 B2 * | 6/2010 | Dubinko et al. ............ 707/723 |
| 2005/0055367 A1 | 3/2005 | Vo et al. |
| 2005/0192994 A1 | 9/2005 | Caldwell et al. |
| 2006/0233257 A1 | 10/2006 | Keith et al. |
| 2006/0251330 A1 | 11/2006 | Toth et al. |

OTHER PUBLICATIONS

N. Jesper Larsson, The Context Trees of Block Sorting Compression, 2000, pp. 1-10.*
Huang et al., "Windowed Huffman coding algorithm with size adaptation," IEE Proceedings-I, V140, N2, Apr. 1993, pp. 109-113.
"Effective Inter-Parallel Schemes for Compression/Decompression Speed-up," IBM TDB, V40, N4, Apr. 1997, pp. 157-165.
"Maximum Entropy Method of Data Encoding for Dictionaries and Texts," IBM TDB, V33, N6B, Nov. 1990, pp. 45-46.

* cited by examiner

*Primary Examiner*—Neveen Abel Jalil
*Assistant Examiner*—Sherief Badawi
(74) *Attorney, Agent, or Firm*—IP Authority, LLC; Ramraj Soundararajan; Van Nguy

(57) ABSTRACT

A frequency partitioning technique is introduced that amortizes the work of computing codeword lengths within a tuple-code by grouping together tuples that have the same pattern of codeword lengths. Specifically, the technique entropy codes and partitions column values in each column into disjoint sets called column partitions, assigns a codeword length to each of the column partitions, identifies cells (a combination of codeword lengths), and collectively storing tuples associated with each of the cells.

18 Claims, 9 Drawing Sheets identifying a plurality of attributes associated with a database and identifying a set of one or more attribute values for each of said identified attributes

702 partitioning the set of attribute values for each identified attribute into one or more attribute partitions

704 identifying a plurality of cells, each cell representing a combination of disparate attribute partitions, wherein the disparate attribute partitions belong to different attributes

706 collectively storing database records associated with each of said plurality of cells, wherein the computer-based partitioning method stores database records of a given cell together

FREQUENCY PARTITIONING: ENTROPY COMPRESSION WITH FIXED SIZE FIELDS

BACKGROUND OF THE INVENTION

1. Field of Invention

The present invention relates generally to the field of compression. More specifically, the present invention is related to a system and method for frequency partitioning using entropy compression with fixed size fields.

2. Discussion of Related Art

Compression is an important aspect of various computing and storage systems. Prior art compression schemes suffer from the drawback of being computationally intensive.

Lossless compression of relational data is a well-studied problem. Existing compression techniques work by eliminating three kinds of redundancy in relational data: repeated values, skewed data distributions and tuple ordering.

Repeated values are very common in real-world databases. Data items like prices, names, and flags can all be quite long and may appear in many places in a dataset. Dictionary coding, the process of replacing each instance of a data item with a short codeword and using a dictionary data structure to convert codewords back into values, can reduce the size of such data items.

Skewed data distributions are also very common in real-world applications. Entropy coding is a version of dictionary coding that takes advantage of this skew by assigning shorter codes to more common values, while giving less common values longer codes. For example, while the first name column in a payroll database may support strings of up to 255 characters, in practice there may be only a few thousand names, and among these some names are much more common than others. By using a dictionary to store the values, we save on repeated names, and by using an entropy code to index the dictionary, we save bits for representing the most common values.

Entropy compression comprises a range of techniques for compressing data close to its entropy, the theoretical limit of compressability as defined by Shannon's Information Theory. Entropy compression techniques must exploit skew, differences in the frequencies of data values or combinations of values. Huffman coding and arithmetic coding are commonly used techniques for entropy coding. In either scheme, frequent data values are represented using short codes, less frequent values are represented with middle length codes, and infrequent values are represented with longer codes.

Seemingly inherent in entropy compression is the property that they result in sequences of variable length codes. This is a problem because as the codes are variable length, we need to determine the length of code i before we can start parsing code i+1, because otherwise we would not know where code i+1 begins. Dealing with the codes one by one reduces the ability to parallelize the processing of many codes in a long sequence.

Making efficient use of modern processors requires using parallelism. Modern processors have three forms of parallelism:

Processors contain multiple cores which can run independent threads or processes.

Each core can itself exploit Instruction Level Parallelism, where a processor can execute several instructions simultaneously as long as those instructions do not depend on each other.

Each instruction can exploit data parallelism, where long registers (64 or 128 bits in most cases) or vectors contain many data items packed closely together and manipulated as a unit.

Sequences of variable length codes make it hard to take advantage of instruction level or data level parallelism, and that limits the effectiveness of each core, slowing down the rate at which data values can be processed from 4 to 16 times, depending on the number of functional units and the width of the registers or vectors. Core level parallelism is not affected by traditional entropy encoding, it is done intelligently.

As mentioned earlier, a well-known type of entropy coding is Huffman coding, which produces prefix codes. In Huffman coding, shorter codewords are guaranteed not to be prefixes of longer codewords. As a result, each codeword implicitly encodes its own length as well as a value of the code. This property allows a compression system to pack codewords of different lengths together. During decompression, the system uses the implicit length information to find the boundaries of the packed codewords.

US Patent Publication 2005/0055367 teaches a method for breaking up an input into windows, such that each window has data of different frequency distribution, and using a separate Huffman dictionary for each window. But, as noted above, Huffman coding uses variable length codes and provides no teaching or suggestion for using fixed length codes. Further, such techniques based on Huffman coding do not partition the input and use fixed length codes in each window. Further, US Patent Publication 2005/0055367 partitions ordered input, and so can only split it into windows that respect the given ordering of the input. However, no teaching or suggestion is provided by such techniques for partitioning databases which are unordered collections of records—so any partitioning can be chosen (in particular multi-dimensional partitioning) that involves reordering the rows of the database.

Relational compression techniques also reduce the size of data by stripping out tuple ordering. Relations are sets, so any information about the order of tuples in a relation is redundant information. A system can remove this redundancy by sorting and delta-encoding compressed tuples. Instead of storing the binary representation of every tuple directly, delta-encoding represents each bit string as a difference, or delta, from the previous tuple's bit string. Since these deltas are relatively small numbers, they can be encoded in fewer bits than the compressed tuples, and can be further compressed using an entropy code.

The combination of using variable-length codewords, sorting, and delta encoding compresses relational data to within a constant factor of its absolute minimum size, or entropy.

In the context of an OLAP star schema, this compression typically proceeds in three passes over the data. First, the system analyzes the data to determine an optimal coding of the values from each column so as to approach entropy. Then it joins the fact table and dimension tables to form a single "universal" relation and at the same time converts each tuple of the relation into a tuplecode, or concatenation of codewords, by dictionary-coding each field. The final pass involves sorting and delta-encoding the tuplecodes and writing out the encoded delta values. Decompression happens in the reverse order: the delta-coding is undone and individual fields are decoded as needed, using the dictionary.

As we noted previously, variable-length dictionary codes are essential to achieving acceptable compression ratios when compressing relational data. Unfortunately, variable-length codes are also a major source of CPU overhead in today's compressed databases.

The compressor packs the individual compressed field codes of a tuple into a tuplecode. To access the i'th field of a tuplecode, the system must parse fields 1 through i–1 to determine their code lengths. This parsing creates control and data dependencies that severely impact performance on modern processors. Worse, these dependencies frustrate the goal of avoiding any decompression costs. We would like to avoid accessing the portions of the tuple that are not relevant to the query, but the cascading field offsets within a tuplecode force the system to compute many more code lengths than are necessary. Such overhead is a well known problem in the prior art.

What is needed is a technique that somehow achieves entropy compression while resulting in sequences of fixed length codes that can be processed efficiently within a core.

Whatever the precise merits, features, and advantages of the above cited prior art techniques, none of them achieves or fulfills the purposes of the present invention.

SUMMARY OF THE INVENTION

The present invention provides a computer-based partitioning method comprising the steps of: (a) identifying a plurality of attributes associated with a database and identifying a set of one or more attribute values for each of said identified attributes; (b) partitioning the set of attribute values for each identified attribute into one or more attribute partitions; (c) identifying a plurality of cells, each cell representing a combination of disparate attribute partitions, said disparate attribute partitions belonging to different attributes; (d) collectively storing database records associated with each of said plurality of cells, wherein the computer-based partitioning method stores database records of a given cell together.

The present invention also provides a computer-based partitioning system implemented via an extract-transform-load module comprising: (a) an analysis component implementing an analysis phase, said analysis component: accessing a database, identifying a plurality of attributes associated with said database, and identifying a set of one or more attribute values for each of said identified attributes, and partitioning the set of attribute values for each identified attribute into one or more attribute partitions; and (b) a compression component implementing a compression phase, said compression component: identifying a plurality of cells, each cell representing a combination of disparate attribute partitions, said disparate attribute partitions belonging to different attributes; representing values of attributes associated with each cell using a fixed length representation, and collectively storing database records associated with each of said plurality of cells, wherein said computer-based partitioning system stores records of a given cell together.

The present invention also provides for an article of manufacture comprising a computer user medium having computer readable program code embodied therein which implements a computer-based frequency partitioning method, wherein the medium comprises: (a) computer readable program code identifying a plurality of attributes associated with a database and identifying a set of one or more attribute values for each of said identified attributes; (b) computer readable program code partitioning the set of attribute values for each identified attribute into one or more attribute partitions, each partition representing a disjoint set of attribute values; (c) computer readable program code identifying a plurality of cells, each cell representing a combination of disparate attribute partitions, said disparate attribute partitions belonging to different attributes; (d) computer readable program code providing instructions to collectively store database records associated with each of said plurality of cells.

The present invention uses compression solely for the purpose of improving query performance. High compression ratios are only important in that they allow the system to keep more data in higher levels of the memory hierarchy, avoiding I/O bottlenecks.

BRIEF DESCRIPTION OF THE DRAWINGS

FIG. 7 illustrates one embodiment of the present invention's computer-based partitioning method.

DESCRIPTION OF THE PREFERRED EMBODIMENTS

Figure 1A:
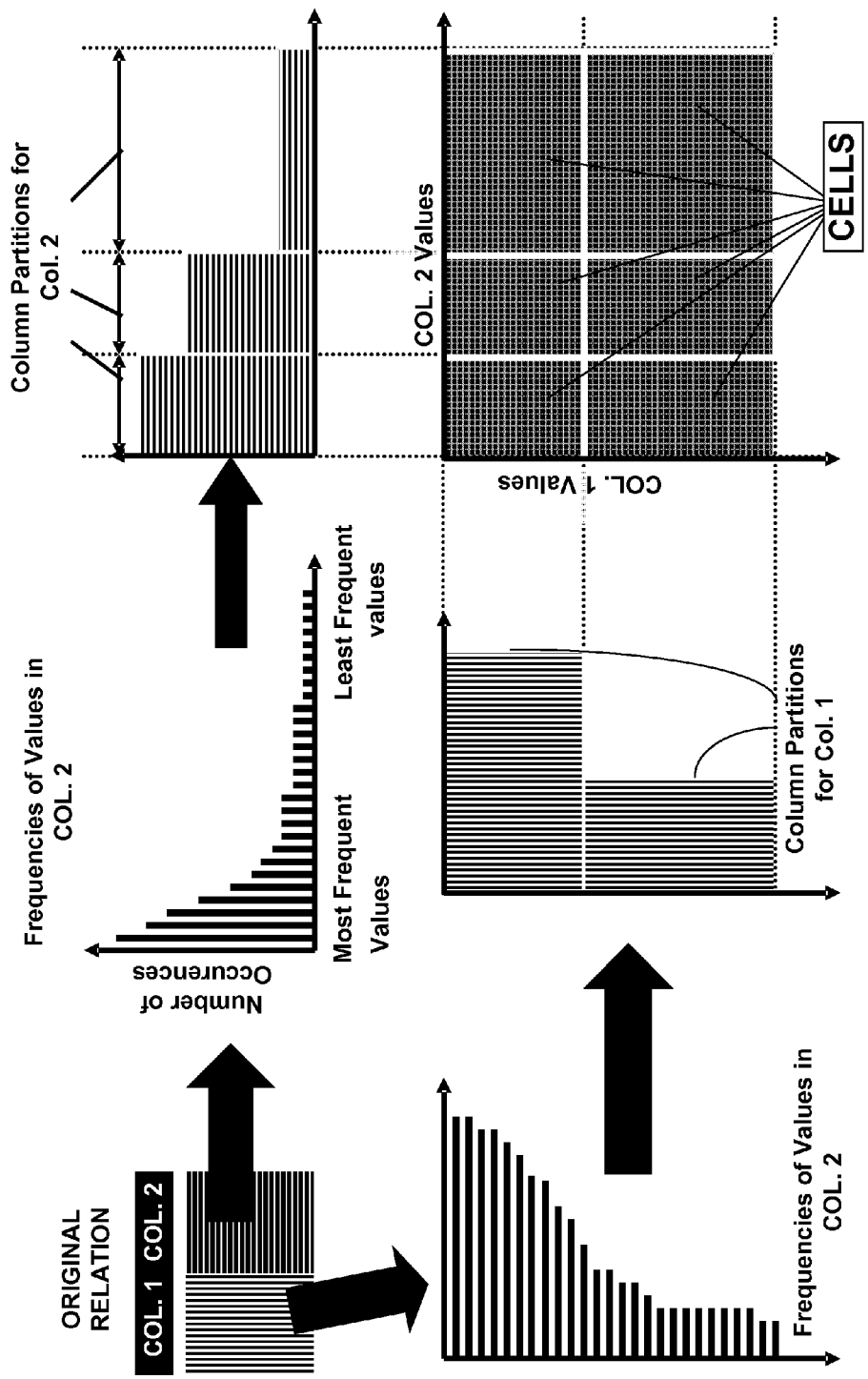
FIG. 1a-b illustrates the present invention's frequency partitioning scheme as applied to a two-column table and three-column table, respectively.

The paper by Raman et al. entitled, "Constant-Time Query Processing," to be published in the Proceedings of the $24^{th}$ IEEE International Conference on Data Engineering, held Apr. 7-12, 2008, in Cancun, Mexico, attached in Appendix A, provides additional details regarding a simplified database architecture that achieves constant time query processing.

While this invention is illustrated and described in a preferred embodiment, the invention may be produced in many different configurations. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

Frequency partitioning takes a different approach from that taken in traditional entropy coding: Rather than representing data in the same order that it appears in the original input, or partitioning it by value, the data is partitioned such that data items whose values have similar frequency are stored together. Once this partitioning is complete, a fixed length code is assigned to each value within the partition. It should be noted that different partitions will have different code lengths, but the format is fixed within a given partition. A fixed format refers to ability to use instruction and register level parallelism within a partition.

To take best advantage of frequency partitioning, the query needs to be compiled for the format of the partition, as there is an overhead in doing this per partition compilation. To amortize this overhead, there must be enough data in the partition so that the gains in processing speed far outweigh the compilation overhead.

Thus, a comprehensive solution to the frequency partitioning includes a mechanism for determining the partitioning in such a way that:

we approach the compressability of traditional entropy compression; and the number of partitions are limited so that the overhead of partition processing is far less than the cost of processing the data within the partition.

A key idea is that a histogram is built of each column in the input data, which is then used to determine the optimal k way partitioning of the individual columns so that size of the representation of these values can be minimized. This is done using a dynamic programming algorithm using a novel objective function.

Once this is done, a determination is done as to which columns to partition (and into how many pieces they are to be partitioned into) using a greedy algorithm. A decision needs to be made regarding when to stop the partitioning so that too many small partitions are not created. A zero length partition does not computationally cost anything, but a partition with just one node can be computationally expensive. A technique is described where partitioning results in uniform cells, that is, where the complete set of column level partitions induce a tuple level partitioning. As partitioning occurs, the number of non-empty cells is estimated.

Also described is an adaptive multi-level partitioning technique. In this approach, the columns are ordered by the compression benefit received by partitioning on the column. Then, the column level partitioning is applied, one at a time. After each partitioning, the set of resulting partitions are examined and partitioning is only continued on the partitions that are still above a certain minimum size. According to this technique, partitions with many tuples are partitioned on more columns allowing the data to achieve greater compression, but partitions with few tuples are left less compressed. This results in greater compression for a given number of partitions, or equivalently, few partitions, and thus less overhead, for a given level of compression.

To reduce the overhead of extracting codewords from compressed tuples, a compression technique, referred to in the specification as frequency partitioning, is disclosed. Beyond its immediate applications to decompression, frequency partitioning has proven to have significant performance benefits in other aspects of query processing. The present invention's technique has been essential both in improving absolute performance, and in enabling parallel query execution.

Frequency partitioning involves amortizing the work of computing codeword lengths within a tuplecode by grouping together tuples that have the same pattern of codeword lengths. FIG. 1a illustrates the present invention's frequency partitioning technique, as applied to a two-column table. Entropy coding divides the values in each column into column partitions according to frequency and assigns a codeword length to each column partition. Each combination of codeword lengths (and hence column partitions) creates a cell. The present invention stores all the tuples of a given cell together, allowing the system to amortize much of the work of decompression. The system creates a dictionary of fixed-length codewords for each column partition. If these dictionaries are used to encode the original tuples of the relation, every tuple in a given cell is guaranteed to have the same pattern of codeword lengths.

Figure 1B:
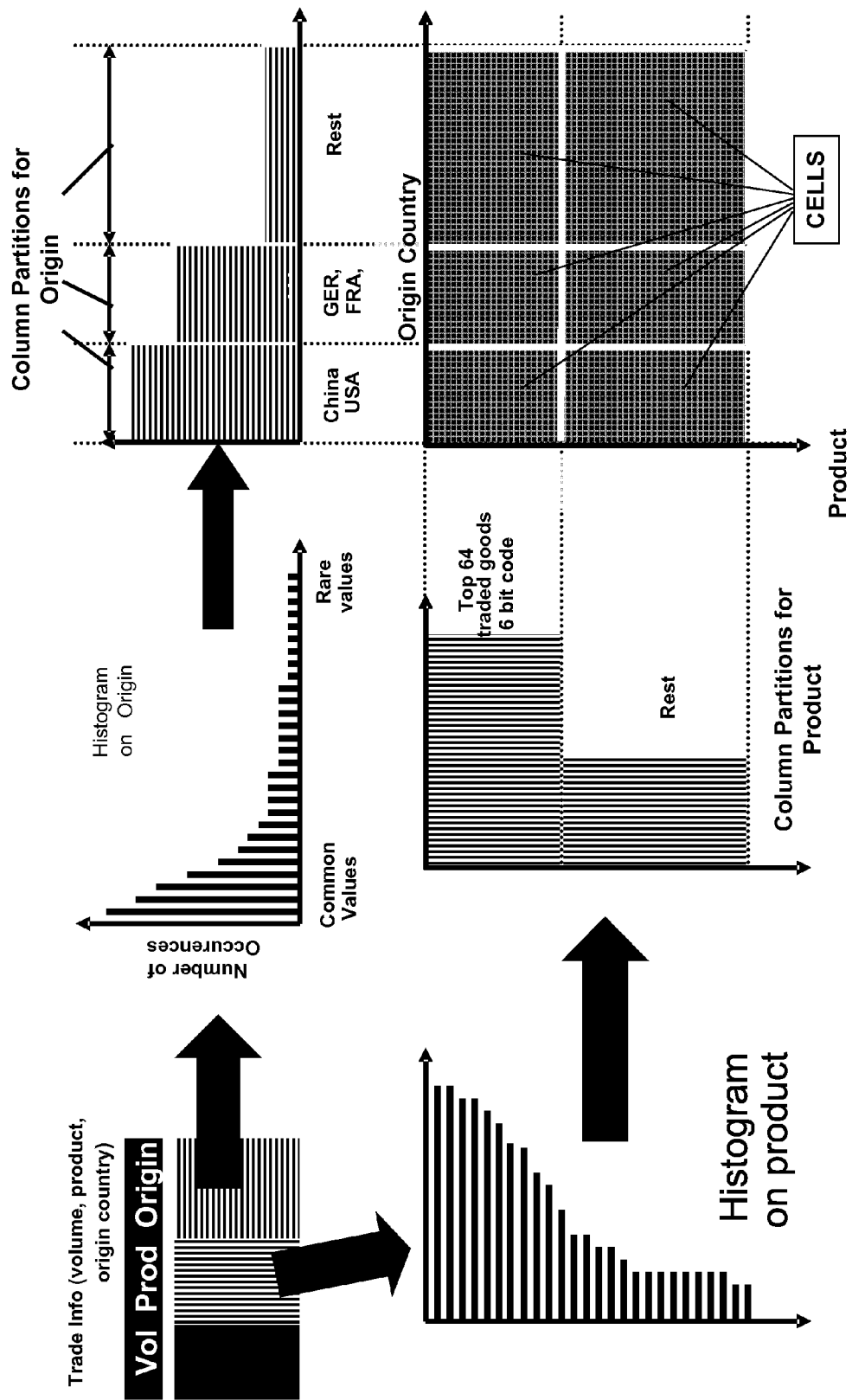

FIG. 1b illustrates another example showing a database having 3 attributes: volume of trade (Vol), product being traded (Prod), and country of origin (Origin). Three attribute partition are formed on Origin values: $O_1$={China, USA}, $O_2$={GER, FRA}, $O_3$={all others}. Two attribute partitions are formed on Product values: one partition $P_1$ with the 64 most-frequent products, and the other partition $P_2$ with all other product values. A single attribute partition is formed on volume values i.e., it is left unpartitioned—call this as $V_1$.

Figure 3:
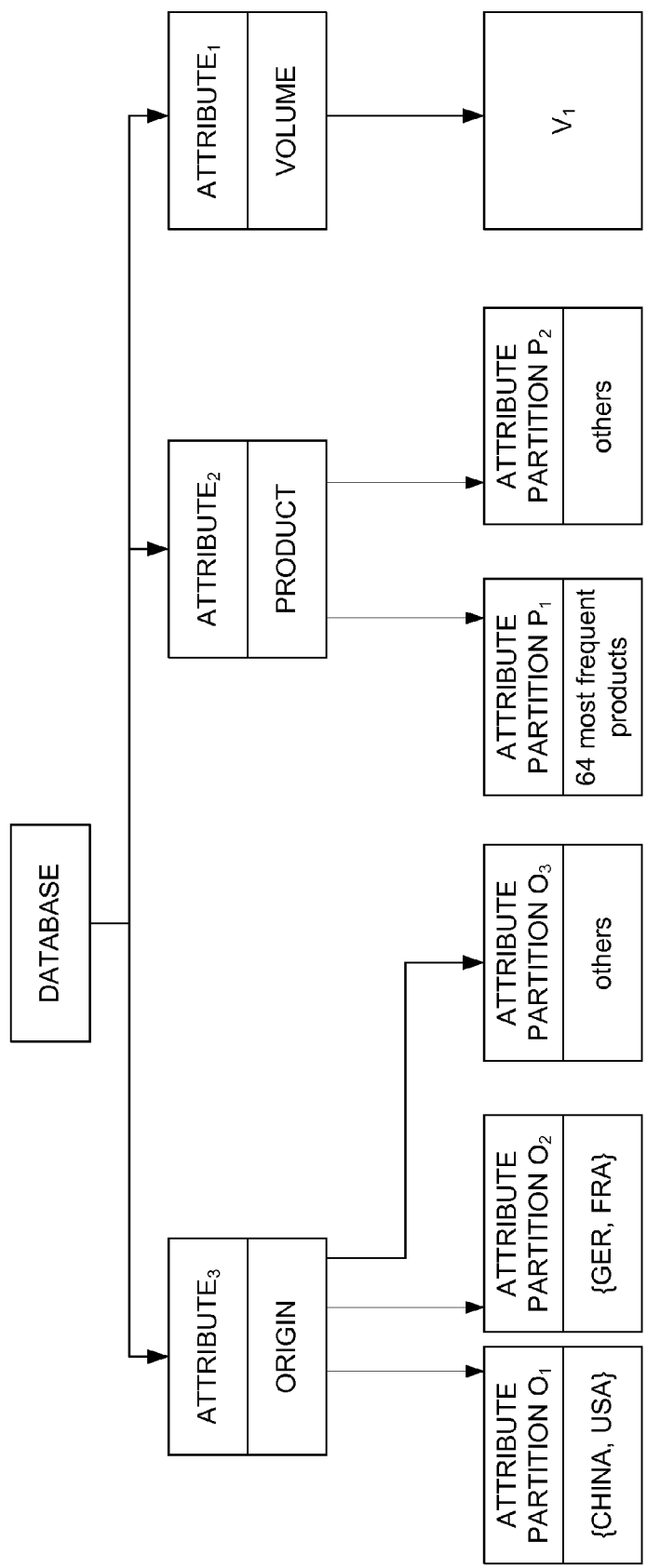
FIG. 3 illustrates a map depicting a database that has three Attributes: $Attribute_1$—ORIGIN, $Attribute_2$—PRODUCT, and $Attribute_3$—VOLUME.

FIG. 3 illustrates a map depicting a database that has three Attributes: $Attribute_1$—ORIGIN, $Attribute_2$—PRODUCT, and $Attribute_3$—VOLUME. The ORIGIN attribute is partitioned into three partitions: ATTRIBUTE PARTITION $O_1$—{CHINA, USA}, ATTRIBUTE PARTITION $O_2$—{GER, FRA}, and ATTRIBUTE PARTITION $O_3$—{others}. The PRODUCT attribute is partitioned into two partitions: ATTRIBUTE PARTITION $P_1$—{64 most frequently traded goods} and ATTRIBUTE PARTITION $P_2$—{others}. The VOLUME attribute is unpartitioned and holds values $V_1$.

It should be noted that a record is in cell $\{O_1, P_1, V_1\}$ if its ORIGIN attribute belongs to $O_1$ AND its PRODUCT attribute belongs to $P_1$ AND its VOLUME attribute belongs to $V_1$.

Figure 4:
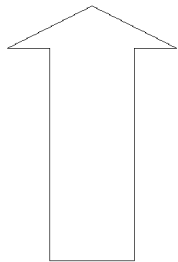
FIG. 4 illustrates an example depicting the formation of cells according to the teachings of the present invention.

FIG. 4 illustrates the formation of cells according to the present invention. Six cells are identified according to the present invention, wherein each cell represents a combination of disparate attribute partitions (e.g., combination of ATTRIBUTES O1, P1, and V1), wherein the disparate attribute partitions belong to different attributes. In this example, the following six cells are formed: (1) $O_1, P_1, V_1$, (2) $O_1, P_2, V_1$, (3) $O_2, P_1, V_1$, (4) $O_2, P_2, V_1$; (5) $O_3, P_1, V_1$, and (6) $O_3, P_2, V_1$.

Figure 5:
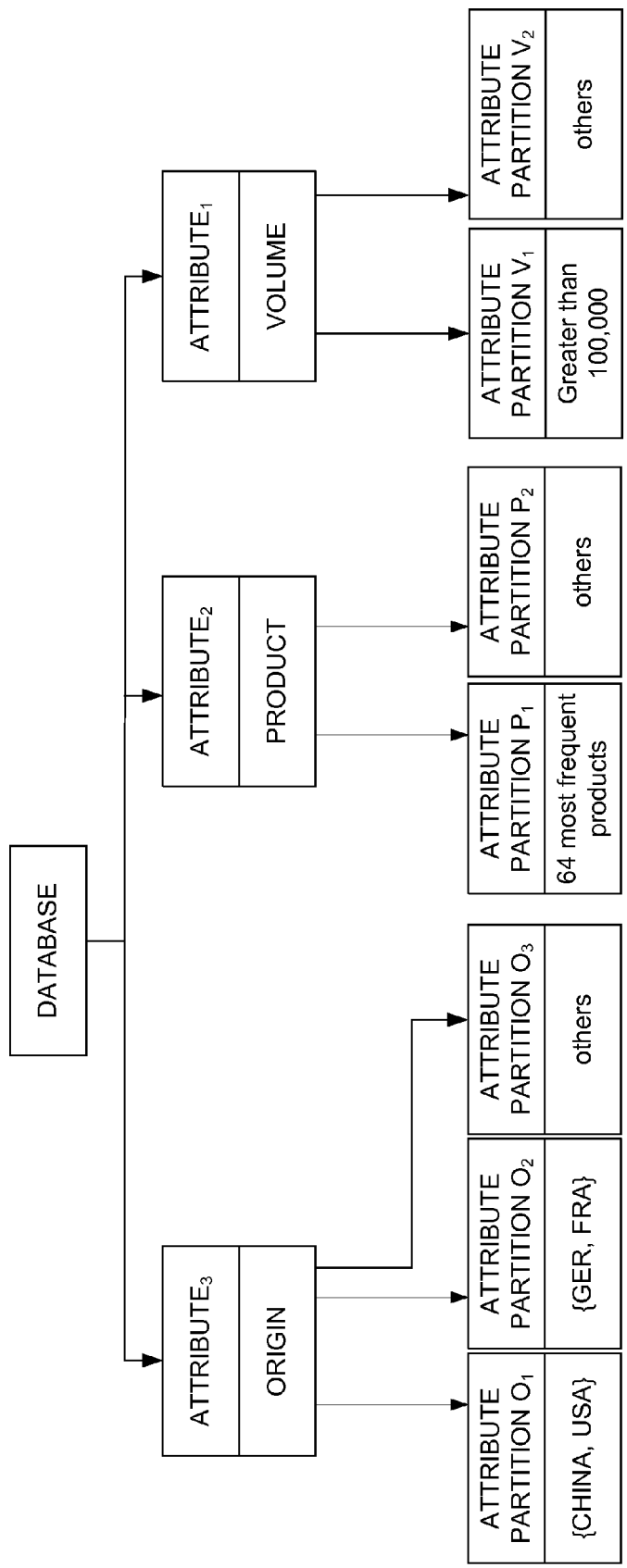
FIG. 5 illustrates a map depicting a database that has three Attributes: $Attribute_1$—ORIGIN, $Attribute_2$—PRODUCT, and $Attribute_3$—VOLUME, but partitioned differently than the database shown in FIG. 3.
Figure 6:
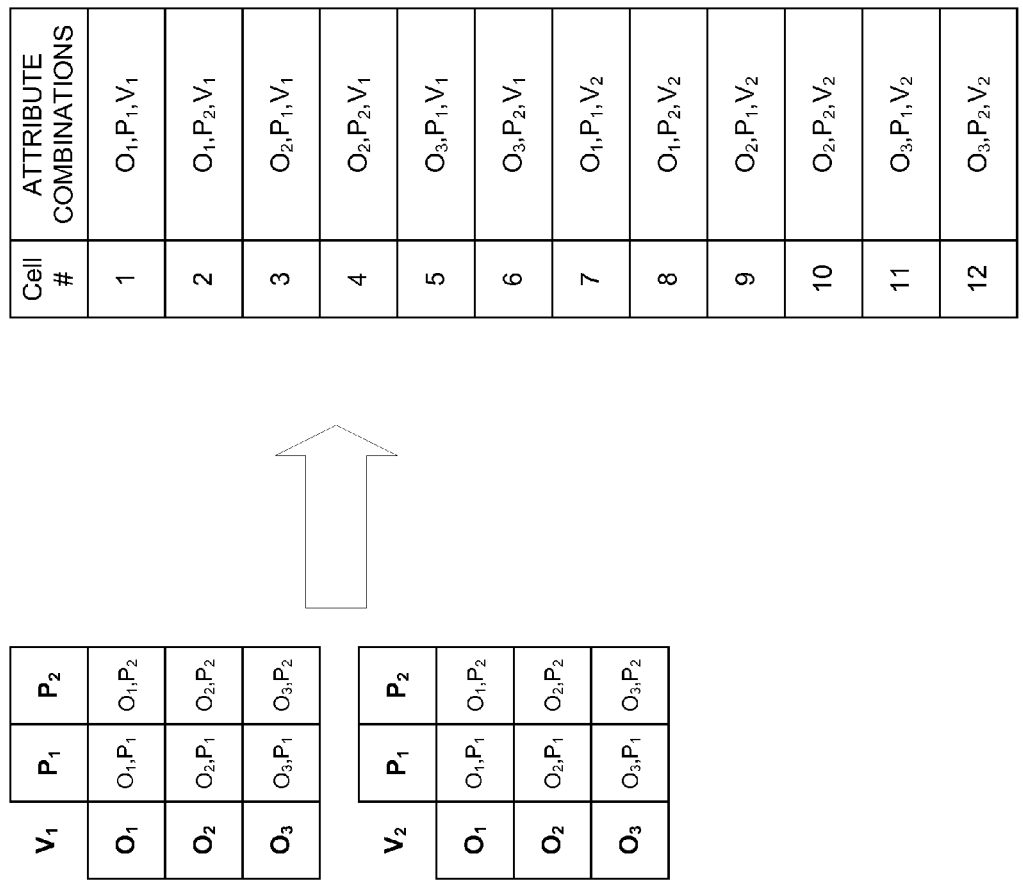
FIG. 6 illustrates another example depicting the formation of cells.
Figure 8:
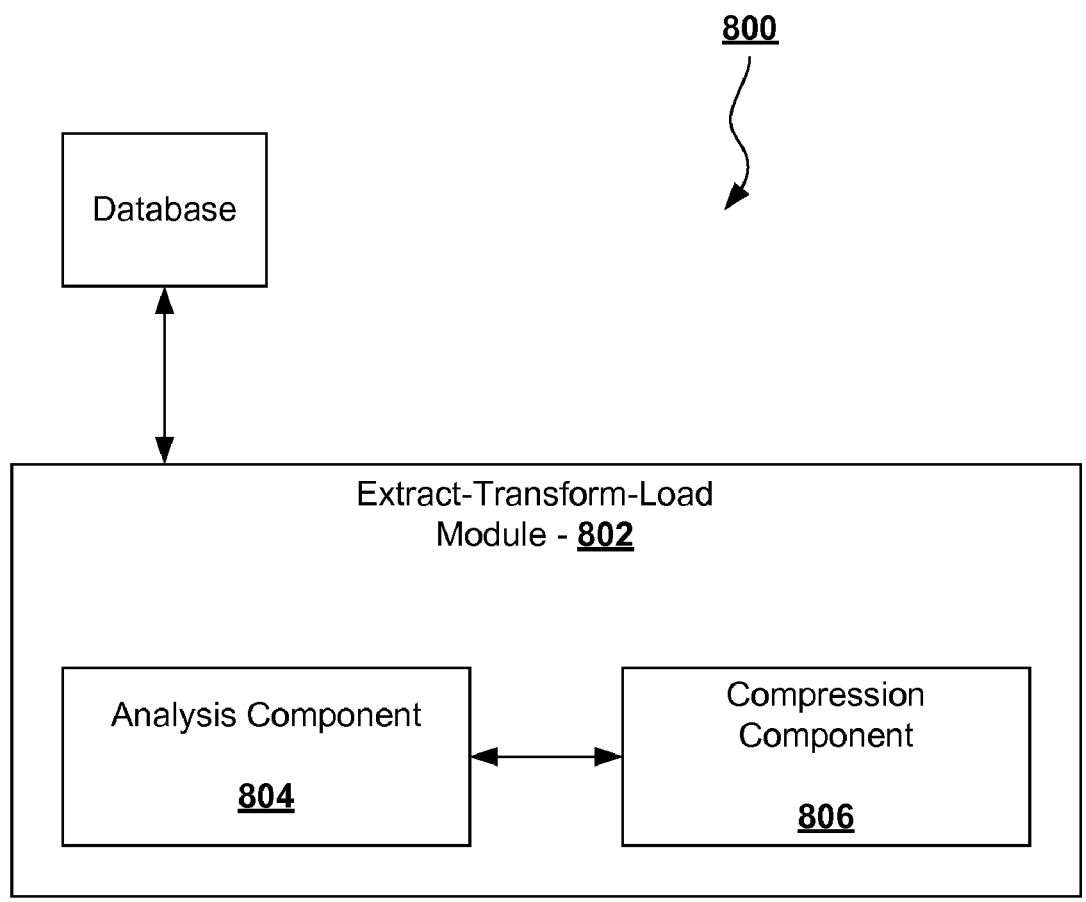
FIG. 8 illustrates the present invention's computer-based partitioning system implemented via an extract-transform-load module.

FIGS. 5 and 6 illustrate a similar example, except now the VOLUME attribute has two partitions: $V_1$ and $V_2$. In this case, as can be seen from FIG. 6, a total of twelve cells are identified according to the present invention, wherein each cell represents a combination of disparate attribute partitions (e.g., combination of ATTRIBUTES O1, P1, and V1), wherein the disparate attribute partitions belong to different attributes. In this example, the following twelve cells are formed: (1) $O_1, P_1, V_1$, (2) $O_1, P_2, V_1$, (3) $O_2, P_1, V_1$, (4) $O_2, P_2, V_1$; (5) $O_3, P_1, V_1$, (6) $O_3, P_2, V_1$ (7) $O_1, P_1, V_2$, (8) $O_1, P_2, V_2$, (9) $O_2, P_1, V_2$, (10) $O_2, P_2, V_2$; (11) $O_3, P_1, V_2$, and (12) $O_3, P_2, V_2$.

In one embodiment, as shown in FIG. 7, the present invention provides a computer-based partitioning method 700 comprising the steps of: (a) identifying a plurality of attributes associated with a database and identifying a set of one or more attribute values for each of said identified attributes—step 702; (b) partitioning the set of attribute values for each identified attribute into one or more attribute partitions (in one particular embodiment, each partition represents a disjoint set of attribute values)—step 704; (c) identifying a plurality of cells, each cell representing a combination of disparate attribute partitions, said disparate attribute partitions belonging to different attributes—step 706; (d) collectively storing database records associated with each of said plurality of cells, wherein the computer-based partitioning method stores database records of a given cell together—step 708.

A column partition is computed for each column. Let R be a relation that is made up of n columns numbered 1 through n. Let $R^i$ be the set of values that can be stored in column i so the domain of the table R is $x_i R^i$. A column partitioning of a relation R is a partitioning of the columns of R. Consider column i, partitioned into $p_i$ partitions labeled $R_1^i$ through $R_{p_i}^i$ so that $\cup_{1 \leq j \leq p_i} R_j^i = R^i$. So, instead of a single dictionary of codewords per column, a separate dictionary is used for each column partition.

A column partitioning induces a partitioning of the domain of R into cells. Each cell is labeled with a cell id, a vector id that indicates a partition of each column, that is, id is chosen from $x_11, \ldots, p_i$. Each cell id is associated with a particular product $x_iR_{ik_i}^i$. In this way, a set of column partitions induces a partitioning on the tuples of R based on the value of each tuple.

A cell partitioning implies an efficient fixed-length representation of tuples within each cell. Within a cell, each column value is chosen from a restricted set. For example, if column i of a particular row is chosen from column i's partition k, then there are only $|R_k^i|$ column values possible. The choice of value can be represented using $\lceil \lg |R_k^i| \rceil$ bits. We can encode a cell with cell id id={$id_1, id_n$} by concatenating codes from the indicated column partitions to form tuplecodes of length $\Sigma_i \lceil \lg |R_k^i| \rceil$.

Each cell is annotated with metadata about the lengths of code-words within the partition. In order to use cell partitioning for compression, the column partitioning is formed so as to minimize the length of the resulting tuples and the partitioning overhead. This can be done by choosing partitions so that frequent values are in small partitions with short codes, while infrequent values are in partitions with longer codes (hence, the term frequency partitioning).

A naive way to create frequency based column partitions is to compute a Huffman code dictionary for each of the columns and use the length of the resulting codewords to guide the partitioning. This naive approach suffers from two serious problems. First, it wastes space. Huffman codes are prefix codes: they encode the length of the code as well as the code. Instead, we can use a simple binary code that utilizes the b bits in the code to represent any of $2^b$ possibilities.

The second problem with the naive approach is more subtle but has serious performance implications. Depending on the distribution of the input data, Huffman coding may produce many different code lengths and hence many different column partitions. The number of cells is bounded by the product of the number of column partitions across all columns, so a large number of column partitions lead to an extremely large number of cells.

As was noted earlier, a key purpose of frequency partitioning is to amortize work across entire cells. If there are too many cells, each cell will contain only a small number of tuples, and this amortization will not work. Also, each cell requires a header for storing metadata; if there are too many cells, these headers will lead to a loss of compression. Finally, since each cell is stored separately, we cannot delta-code across cells. This limitation results in a further loss of compression.

More formally, a partitioning of a probability distribution S with probability function p is a set of distributions induced by a partitioning of the range of S into sets $S_1$ through $S_k$, where the probability function of each partitioned distribution $S_i$ is given by $p_i$. Let $p_i(s)=p(s)/P(Si)$, where $P(S_i)=\Sigma_{u \in S_i} p(u)$. The distribution induced on S by the partition $S_i$ is denoted as $S|S_i$ as it acts as S conditioned on the value being in the partition $S_i$.

Figure 2:
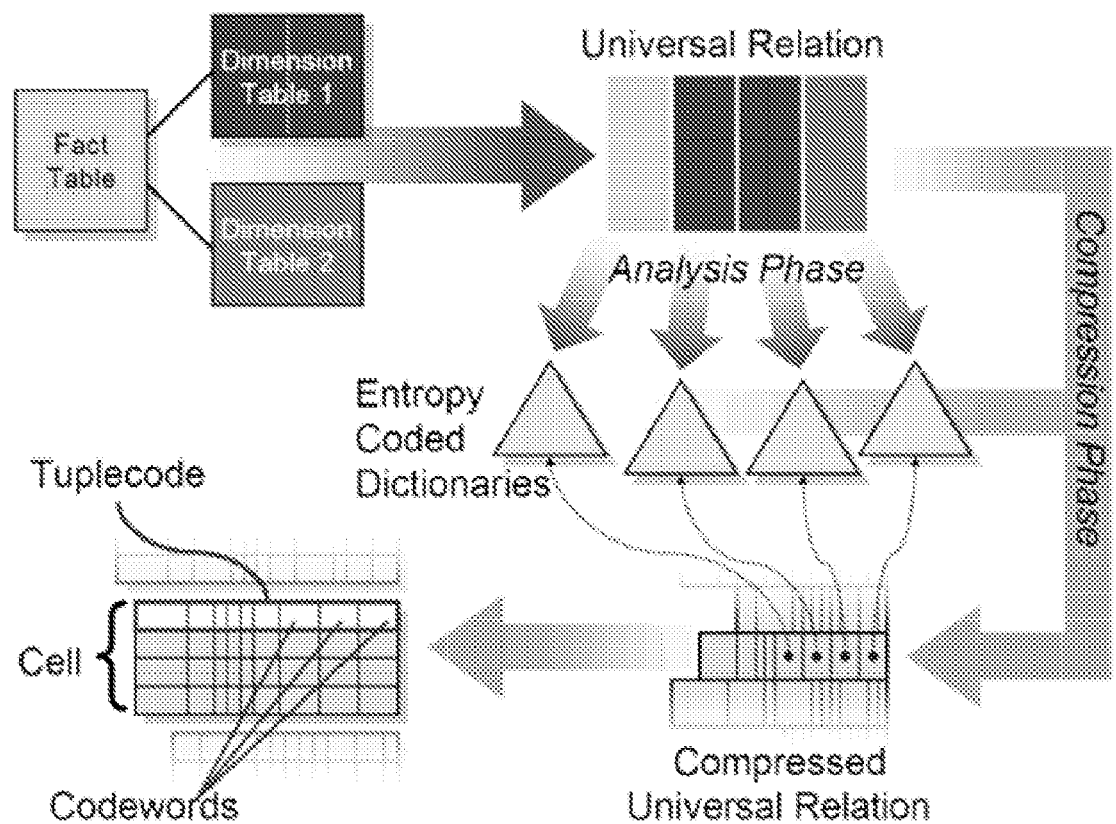
FIG. 2 illustrates the present invention's system as implemented in an extract-transform-load (ETL) module.

FIG. 2 illustrates the present invention's system as implemented by an Extract-Transform-Load (ETL) module. The ETL process starts by joining the fact and dimension tables (extracted from the operational system) into a single universal relation. This relation forms the input of an analysis phase, in which the module collects statistics on each column and defines column partitions. Next, the system entropy-codes each column of the universal relation to produce dictionaries that map compact codewords to column values. The system then uses the dictionaries to encode each tuple of the universal relation and partitions the compressed tuples into cells. When the analysis phase (implemented via an analysis phase component that is not shown) completes, the ETL module creates a dictionary for the values in each column partition. In the preferred embodiment, the last two steps are done in one pass. Also, cells are stored using delta-encoding (not shown).

After the analysis phase, the ETL module enters the compression phase (implemented via a compression phase component that is not shown). The module uses the dictionaries from the analysis phase to encode each tuple of the universal relation and partitions the resulting tuplecodes into cells. Once all the data has been partitioned and coded, the module sorts and delta-encodes within each cell.

The goal of the analysis phase of the ETL module is to partition column values in the universal relation so that values with similar probabilities are in the same partition. To accomplish this, the distinct values in a column are taken to build a histogram. Then, the values are sorted in order by decreasing frequency. Given the number of partitions that are budgeted for this column, optimal partitioning is determined such that it minimizes the objective function:

$$\sum_i P(S_i)(\lceil \lg|S_i|\rceil - \lg P(S_i))$$

The optimization can proceed efficiently because of the following three observations:
(i) Any optimal partitioning into k subsets can be specified on intervals of the frequency sorted values. This can be shown by contradiction: If an optimal partitioning was not in order of frequency, then we could swap two misordered elements and improve the partitioning.
(ii) Any optimal partitioning will have non-decreasing lengths. If the length of a partition of higher frequency elements was longer than a partition of lower frequency elements, then compression would improve by swapping elements from the lower frequency partition with elements from the higher frequency partition.
(iii) Any optimal partitioning will have a power of two elements except for the last partition. If a non-terminal partition were not a power of two, we could improve compression by moving the next element into this partition.

Using these three observations an efficient dynamic program is implemented to find an optimal partitioning of a column of length k. The dynamic program works recursively by splitting the $k^{th}$ partition from the k–1 partition at all places in the frequency sorted list of values that are compatible with the rules above. The dynamic program then calls the optimization step recursively to find the optimal partitioning of the remaining values into k–1 partitions.

The next step in optimization is to decide how to allocate partitions among the columns, that is, what is the value of k that we want to pass into the optimal partitioning algorithm described above? This is done using a greedy optimization on top of the column level dynamic program. At each step, a determination is made as to which column could make best use of an extra partition, by computing the optimal partition of each column using one more partition than we are currently using. Then, the benefit of this extra partition is estimated, and the number of additional cells that will be generated by adding the partition is also estimated. These estimates are made using a column independence assumption.

Finally, to produce the optimal partitioning that fits within a given cell budget, the greedy optimization step is applied repeatedly until any additional partitioning would cause the cell budget to be exceeded.

In one embodiment, the present invention also provides a computer-based partitioning system 800 implemented via an extract-transform-load module 802 comprising: (a) an analysis component 804 implementing an analysis phase, said analysis component: accessing a database, identifying a plurality of attributes associated with said database, and identifying a set of one or more attribute values for each of said identified attributes, and partitioning the set of attribute values for each identified attribute into one or more attribute partitions, each partition representing a disjoint set of attribute values; and (b) a compression component 806 implementing a compression phase, said compression component: identifying a plurality of cells, each cell representing a combination of disparate attribute partitions, said disparate attribute partitions belonging to different attributes; representing values of attributes associated with each cell using a fixed length representation, and collectively storing database records associated with each of said plurality of cells, wherein said computer-based partitioning system stores records of a given cell together.

Additionally, the present invention provides for an article of manufacture comprising computer readable program code contained within implementing one or more modules for frequency partitioning. Furthermore, the present invention includes a computer program code-based product, which is a storage medium having program code stored therein which can be used to instruct a computer to perform any of the methods associated with the present invention. The computer storage medium includes any of, but is not limited to, the following: CD-ROM, DVD, magnetic tape, optical disc, hard drive, floppy disk, ferroelectric memory, flash memory, ferromagnetic memory, optical storage, charge coupled devices, magnetic or optical cards, smart cards, EEPROM, EPROM, RAM, ROM, DRAM, SRAM, SDRAM, or any other appropriate static or dynamic memory or data storage devices.

Implemented in computer program code based products are software modules for: identifying a plurality of attributes associated with a database and identifying a set of one or more attribute values for each of said identified attributes; partitioning the set of attribute values for each identified attribute into one or more attribute partitions, each partition representing a disjoint set of attribute values; identifying a plurality of cells, each cell representing a combination of disparate attribute partitions, said disparate attribute partitions belonging to different attributes; and collectively storing database records associated with each of said plurality of cells, wherein said computer-based partitioning method stores database records of a given cell together.

CONCLUSION

A system and method has been shown in the above embodiments for the effective implementation of a frequency partitioning system and method. While various preferred embodiments have been shown and described, it will be understood that there is no intent to limit the invention by such disclosure, but rather, it is intended to cover all modifications falling within the spirit and scope of the invention, as defined in the appended claims. For example, the present invention should not be limited by software/program, computing environment, or specific computing hardware.

The invention claimed is:

1. A computer-based partitioning method comprising the steps of:
   a. identifying a plurality of attributes associated with a database and identifying a set of one or more attribute values for each of said identified attributes;
   b. partitioning the set of attribute values for each identified attribute into one or more attribute partitions;
   c. identifying a plurality of cells, each cell representing a combination of disparate attribute partitions, said disparate attribute partitions belonging to different attributes;
   d. collectively storing database records associated with each of said plurality of cells, wherein said computer-based partitioning method stores database records of a given cell together, and wherein said attributes are partitioned according to a frequency of occurrence of attribute values, where attributes values with similar frequencies of occurrence are assigned to the same attribute partition.

2. The computer-based partitioning method of claim 1, wherein said method comprises the additional step of representing attribute values in each cell and for a given attribute using fixed length representation.

3. The computer-based partitioning method of claim 2, wherein said fixed length representation is done by assigning a code to each attribute value such that ordering of codes is either same as or inverse of a numerical or alphabetical ordering of attribute values.

4. The computer-based partitioning method of claim 1, wherein said partitioning of column values is optimized based on the following objective function:

$$\sum_i P(S_i)(\lceil \lg |S_i| \rceil - \lg P(S_i))$$

wherein $S_i$ is a set of attribute values in the $i^{th}$ partition and $P(S_i)$ is the frequency of occurrence of said set $S_i$.

5. The computer-based partitioning method of claim 1, wherein said method additionally places a constraint on the total number of cells.

6. The computer-based partitioning method of claim 1, wherein said method implements dynamic programming to determine optimal per column partitioning and further implements a greedy method to determine optimal partitions for conducting said partitioning.

7. The computer-based partitioning method of claim 1, wherein said method results in similar sized partitions by partitioning only the larger partitions.

8. The computer-based partitioning method of claim 1, wherein said method results in similar sized partitions by ordering the column partitions and applying partitioning only to partitions that are larger than a pre-determined size.

9. The computer-based partitioning method of claim 1, wherein each partition represents a disjoint set of attribute values.

10. A computer-based partitioning system implemented via an extract-transform-load module stored in computer storage medium, said computer storage medium comprising computer readable program code, which when executed by a computer, provides:
   a. an analysis component implementing an analysis phase, said analysis component:
      i. accessing a database, identifying a plurality of attributes associated with said database, and identifying a set of one or more attribute values for each of said identified attributes, and ii. partitioning the set of values for each identified attribute into one or more attribute partitions;

b. a compression component implementing a compression phase, said compression component:

i. identifying a plurality of cells, each cell representing a combination of disparate attribute partitions, said disparate attribute partitions belonging to different attributes;

ii. representing attribute values in each cell and for a given attribute using fixed length representation;

iii. collectively storing database records associated with each of said plurality of cells, wherein said computer-based partitioning system stores records of a given cell together, and wherein said attributes are partitioned according to a frequency of occurrence of attribute values, where attributes values with similar frequencies of occurrence are assigned to the same attribute partition.

11. The computer-based partitioning system of claim 10, wherein said fixed length representation is done by assigning a code to each attribute value such that ordering of codes is either same as or inverse of a numerical or alphabetical ordering of attribute values.

12. The computer-based partitioning system of claim 10, wherein said partitioning of column values is optimized based on the following objective function:

$$\sum_i P(S_i)(\lceil \lg |S_i| \rceil - \lg P(S_i))$$

wherein $S_i$ is a set of attribute values in the $i^{th}$ partition and $P(S_i)$ is the frequency of occurrence of said set $S_i$.

13. The computer-based partitioning method of claim 10, wherein said system additionally places a constraint on the total number of cells.

14. The computer-based partitioning system of claim 10, wherein said system implements dynamic programming to determine optimal per column partitioning and further implements a greedy method to determine optimal partitions for conducting said partitioning.

15. The computer-based partitioning system of claim 10, wherein similar sized partitions are produced by partitioning only the larger partitions.

16. The computer-based partitioning system of claim 10, wherein said similar sized partitions are produced by ordering the column partitions and applying partitioning only to partitions that are larger than a pre-determined size.

17. The computer-based partitioning system of claim 10, wherein each partition represents a disjoint set of attribute values.

18. An article of manufacture comprising a computer user storage medium having computer readable program code embodied therein which implements a computer-based frequency partitioning method, said medium comprising:

a. computer readable program code identifying a plurality of attributes associated with a database and identifying a set of one or more attribute values for each of said identified attributes;

b. computer readable program code partitioning the set of attribute values for each identified attribute into one or more attribute partitions;

c. computer readable program code identifying a plurality of cells, each cell representing a combination of disparate attribute partitions, said disparate attribute partitions belonging to different attributes;

d. computer readable program code providing instructions to collectively store database records associated with each of said plurality of cells wherein said computer-based partitioning method stores database records of a given cell together, and wherein said attributes are partitioned according to a frequency of occurrence of attribute values, where attributes values with similar frequencies of occurrence are assigned to the same attribute partition.

\* \* \* \* \*